United States Patent [19]

Suzuki et al.

[11] Patent Number: 5,127,029
[45] Date of Patent: Jun. 30, 1992

[54] X-RAY EXPOSURE APPARATUS

[75] Inventors: Masayuki Suzuki, Zama; Shinichiro Uno, Atsugi, both of Japan

[73] Assignee: Canon Kabushiki Kaisha, Tokyo, Japan

[21] Appl. No.: 752,205

[22] Filed: Aug. 21, 1991

Related U.S. Application Data

[63] Continuation of Ser. No. 664,530, Mar. 5, 1991, abandoned, which is a continuation of Ser. No. 496,956, Mar. 21, 1990, abandoned.

Foreign Application Priority Data

Mar. 22, 1989 [JP] Japan .................. 1-070951

[51] Int. Cl.⁵ ............................................ G21K 1/06
[52] U.S. Cl. ...................................... 378/145; 378/34
[58] Field of Search ................. 378/82, 84, 119, 145, 378/146, 34

[56] References Cited

U.S. PATENT DOCUMENTS 4,631,743 12/1986 Tomimasu et al. .................. 378/119

FOREIGN PATENT DOCUMENTS 60-226122 11/1985 Japan .
1041900 2/1989 Japan .................. 378/145

OTHER PUBLICATIONS

Golovchenko et al., "X-ray Monochromator system for use with synchroton radiation source", *Rev. Sci. Instrum.*, 52(4), Apr. 1987, pp. 509–516.
Webb et al., "A Focussing Monochromator for Small Angle Diffraction Studies with Synchroton Radiation", *J. Appl. Cryst.*, Apr. 1977, 10, 104–110.
Haelbich, "Optimization of the Optics Matching a Storage Ring to an X-Ray Lithography Camera", Proceedings of SPIE, vol. 448, Oct. 1983, pp. 93–101.
"Handbook on Synchrotron Radiation", vol. 1B, Chapter 13, pp. 1135–1136, North Holland Publishing Co., Amsterdam, Netherlands, 1983.

*Primary Examiner*—David P. Porta
*Attorney, Agent, or Firm*—Fitzpatrick, Cella, Harper & Scinto

[57] ABSTRACT

An X-ray exposure apparatus includes an X-ray source; and a directing optical system for directing an X-ray beam from the X-ray source to a surface to be exposed, the directing optical system incuding a mirror having a reflection surface of a curvature radius R with respect to a predetermined sectional plane, for reflecting the X-ray beam and for expanding the diameter thereof with respect to the sectional plane; wherein the mirror satisfies the following conditions:

$$R = (2d_1 d_2 \sigma') / \{[\Delta - (d_1 + d_2)\sigma'] \cdot a\}$$

where $d_1$: the distance from the emission point of the X-ray source to the center of effective X-ray beam diameter on the reflection surface;

$d_2$: the distance from the center of effective X-ray beam diameter on the reflection surface to the center of effective X-ray beam diameter on the surface to be exposed;

$\alpha$: the angle defined at the center of effective X-ray beam diameter on the reflection surface, between the X-ray beam and the reflection surface;

$\sigma'$: a standard deviation of a distribution of intensities of the rays having different emission angles at the sectional plane, at the gravity center wavelength of the X-ray beam from the X-ray source;

$\Delta$: $0.43a \leq \Delta \leq 4.0a$; and $a$: the length of the surface to be exposed, with respect to the sectional plane.

27 Claims, 4 Drawing Sheets

X-RAY EXPOSURE APPARATUS

This application is a continuation of application Ser. No. 07/664,530 filed Mar. 5, 1991, now abandoned which is a continuation of application Ser. No. 07/496,956 filed Mar. 21, 1990 now abandoned.

FIELD OF THE INVENTION AND RELATED ART

This invention relates to an exposure apparatus using X-rays and, more particularly, to an X-ray exposure apparatus wherein an X-ray beam from a radiation source such as a synchrotron orbit radiation source (SOR source), for example, is made divergent and thus is expanded for exposure of a surface to be exposed.

SOR source is a radiation source which emits sheet-like electromagnetic waves (X-rays and the like) having a large divergent angle in a horizontal direction but having a small divergent angle in a vertical direction. Because of small divergent angle in the vertical direction, if an X-ray beam from the SOR source is projected directly to a surface to be exposed, only a limited range of the surface with respect to the vertical direction can be illuminated. For this reason, in an X-ray exposure apparatus which uses a SOR source, it is necessary to take some measure for expanding the X-ray beam emitted from the SOR source in the vertical direction.

As an example, a method has been proposed by R. P. Haelbick et al, "J. of Vac. Sci. Technol." B1(4), Oct.--Dec., 1983, pages 1262-1266, according to which a mirror is disposed between a SOR source and a surface to be exposed and the mirror is oscillated with an angle of a few miliradians to scan the whole surface to be exposed, with a slit-like X-ray beam from the SOR source.

With this method, however, at a moment only a part of the surface to be exposed can be irradiated with the X-rays. This results in a possibility of local expansion of the surface to be exposed (e.g. a mask) which leads to distortion of a pattern of the mask to be transferred and thus causes a transfer error. Although such a problem may be solved if the period of oscillation of the mirror is made sufficiently short, in order to assure this it is necessary to use a large drive power. This is inconvenient.

As another example of expanding the X-ray beam in the vertical direction, a method has been proposed by Warren D. Grobman, "Handbook on Synchrotron Radiation", Vol. 1, Chapter 13, page 1135, North-Holland Publishing Co., 1983, according to which a convex mirror is disposed between a SOR source and a surface to be exposed, so that with the reflection by the convex surface of the mirror the angle of divergence of the X-ray beam in the vertical direction is expanded.

This method is free from the problem of local distortion of the pattern as described hereinbefore. However, there is another problem. That is, of the X-ray beam emitted from a SOR source, in a horizontal orbit plane (horizontal section), the X-rays having different emission angles have an intensity distribution which can be considered substantially uniform. However, in a plane (vertical section) perpendicular to the orbit plane, they have an intensity distribution like a Gaussian distribution. This means that there is a difference in intensity between a central part and a peripheral part of the X-ray beam. Therefore, if the X-ray beam is used for the exposure as it is, non-uniform exposure results. Thus, it can not properly be used in an exposure apparatus.

SUMMARY OF THE INVENTION

It is accordingly an object of the present invention to provide an X-ray exposure apparatus having an improved mirror reflection system.

In accordance with an aspect of the present invention, to achieve the above object, there is provided an X-ray exposure apparatus, comprising: an X-ray source; and directing means for directing an X-ray beam from said X-ray source to a surface to be exposed, said directing means including a mirror having a reflection surface of a curvature radius R with respect to a predetermined sectional plane, for reflecting the X-ray beam and for expanding the diameter thereof with respect to said sectional plane; wherein said mirror satisfies the following conditions:

$$R = (2d_1 d_2 \sigma')/\{[\Delta - (d_1 + d_2)\sigma'] \cdot a\}$$

where
- $d_1$: the distance from the emission point of said X-ray source to the center of effective X-ray beam diameter on said reflection surface;
- $d_2$: the distance from the center of effective X-ray beam diameter on said reflection surface to the center of effective X-ray beam diameter on the surface to be exposed;
- $a$: the angle defined at the center of effective X-ray beam diameter on said reflection surface, between the X-ray beam and said reflection surface;
- $\sigma'$: a standard deviation of a distribution of intensities of X-rays having different emission angles at said sectional plane, at the gravity center wavelength of the X-ray beam from said X-ray source;
- $\Delta$: $0.43a \leq 4.0a$; and
- $a$: the length of the surface to be exposed, with respect to said sectional plane.

In accordance with another aspect of the present invention, there is provided an X-ray exposure apparatus, comprising: an X-ray source; and directing means for directing an X-ray beam from said X-ray source to a surface to be exposed, said directing means including a mirror having a cylindrical surface of a curvature radius R, for reflecting the X-ray beam and for expanding the diameter thereof; wherein said mirror satisfies the following condition:

$$R = (2d_1 d_2 \sigma')/\{[\Delta - (d_1 + d_2)\sigma'] \cdot a\}$$

where
- $d_1$: the distance from the emission point of said X-ray source to the center of effective X-ray beam diameter on said reflection surface;
- $d_2$: the distance from the center of effective X-ray beam diameter on said reflection surface to the center of effective X-ray beam diameter on the surface to be exposed;
- $a$: the angle defined at the center of effective X-ray beam diameter on said reflection surface, between the X-ray beam and said reflection surface;
- $\sigma'$: a standard deviation of a distribution of intensities of X-rays having different angles of emission from said X-ray source, in a sectional plane perpendicular to a generating line of said mirror, at the gravity center wavelength of the X-ray beam from said X-ray source;

Δ: 0.43a ≦ Δ ≦ 4.0a; and a: the length of the surface to be exposed, with respect to a direction which is substantially perpendicular to the generating line of said mirror.

In accordance with a further aspect of the present invention, there is provided an X-ray exposure apparatus, comprising: means for supporting a mask; means for supporting a wafer; and directing means for directing an X-ray beam from an X-ray source to the wafer through the mask to thereby expose the wafer to a pattern of the mask, said directing means including a mirror having a cylindrical reflection surface of a curvature radius R, for reflecting the X-ray beam and for expanding the diameter thereof;

wherein said mirror satisfies the following condition:

$$R = (2d_1 d_2 \sigma')/\{[\Delta - (d_1+d_2)\sigma'] \cdot a\}$$

where $d_1$: the distance from the emission point of said X-ray source to the center of effective X-ray beam diameter on said reflection surface;

$d_2$: the distance from the center of effective X-ray beam diameter on said reflection surface to the center of effective X-ray beam diameter on the mask;

α: the angle defined at the center of effective X-ray beam diameter on said reflection surface, between the X-ray beam and said reflection surface;

σ': a standard deviation of a distribution of intensities of X-rays having different angles of emission from said X-ray source, in a sectional plane perpendicular to a generating line of said mirror, at the gravity center wavelength of the X-ray beam from said X-ray source;

Δ: 0.43a ≦ Δ ≦ 4.0a; and a: the length of an area for the pattern of the mask, with respect to a direction which is substantially perpendicular to the generating line of said mirror.

In this Specification, the gravity center wavelength of an X-ray beam from an X-ray source means $\bar{\lambda}_0$ which is given by the following equation:

$$\bar{\lambda}_0 = \left[ \int_{\lambda_1}^{\lambda_2} e(\lambda) \cdot \lambda d\lambda \right] / \left[ \int_{\lambda_1}^{\lambda_2} e(\lambda) d\lambda \right]$$

where λ is the wavelength, e(λ) is the energy of the X-ray beam at the wavelength λ, and $\lambda_1$ and $\lambda_2$ are lower and upper limits of the wavelength region used for the exposure.

In an X-ray exposure apparatus according to one preferred form of the present invention, the mirror of said directing means is set so as to satisfy the following condition:

$$R = (2d_1 \cdot d_2)/\{[\Delta' - (d_1+d_2)] \cdot a\}$$

where $4.3 \times 10^2 a \leq \Delta' \leq 4.0 \times 10^4 a$.

The reflection surface of a mirror usable in the present invention may have a well-known structure effective to reflect X-rays with a good efficiency. For example, it may have a multilayered film structure. The present invention can be applied effectively to an exposure apparatus for manufacture of semiconductor devices, for example, wherein the exposure is performed with X-rays from a SOR source. This is because: With the present invention, it is possible to reduce the non-uniformness in the intensity distribution of an X-ray beam from a SOR source. It is therefore possible to illuminate a mask having a semiconductor circuit pattern with X-rays of a desirable intensity distribution. As a result, the semiconductor circuit pattern of the mask can be transferred to a wafer very accurately.

It is to be noted here that the present invention is applicable to various types of exposure apparatuses such as, for example, a contact type exposure apparatus wherein a mask is contacted to a wafer, a proximity type exposure apparatus wherein a mask is spaced from a wafer through a distance of a few microns to a few tens of microns, and a projection type exposure apparatus wherein a pattern of a mask is projected to a wafer through a projection system including mirrors.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
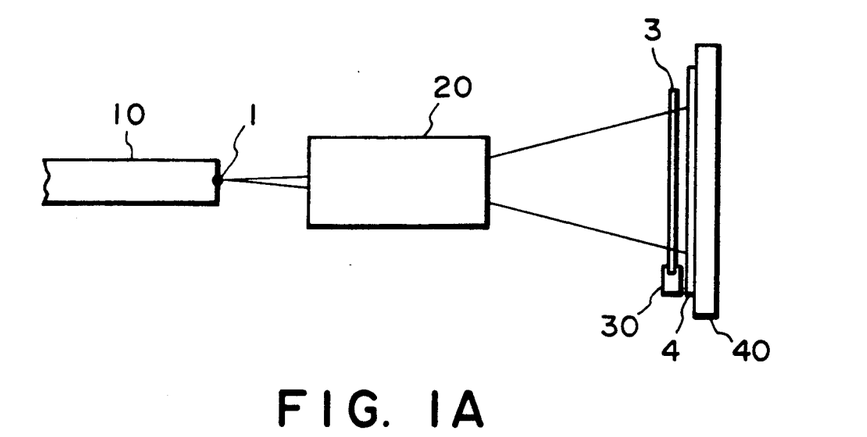
FIGS. 1A and 1B are schematic views of an X-ray exposure apparatus according to an embodiment of the present invention.
Figure 1B:
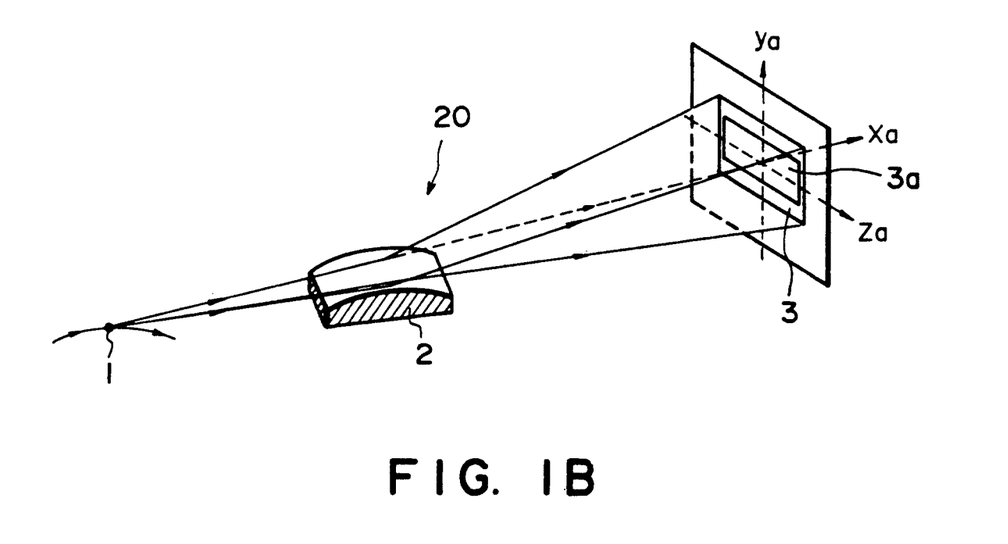

FIGS. 1A and 1B are schematic views, respectively, showing an X-ray exposure apparatus according to an embodiment of the present invention. In FIG. 1A the apparatus includes an X-ray directing means 20, and in FIG. 1B one component of the directing means 20 is illustrated in detail.

In FIGS. 1A and 1B, denoted at 1 is an emission point of a SOR source 10; at 2 is a cylindrical mirror having a convex surface, which is one component of the directing means 20; at 3 is a mask; and at 4 is a semiconductor wafer. In this embodiment, the SOR source 10 and the directing means 20 cooperate to provide an illumination system. The mask 3 has a semiconductor circuit pattern formed thereon, which pattern is at the surface 3a to be exposed. In a zone at the peripheral part of this surface 3a, one or more alignment marks are formed. The mask 3 is supported by a mask stage 30. On the other hand, the wafer 4 has a surface which is coated with a resist, and the wafer 4 is placed on a wafer stage 40. Each of the mask stage 30 and the wafer stage 40 is movable vertically and horizontally as viewed in FIG. 1A, as well as in a direction perpendicular to the sheet of the drawing. With the displacement of the stages 30 and 40, the mask 3 and the wafer 4 can be aligned into a predetermined positional relationship.

The apparatus of the present embodiment is an exposure apparatus of proximity type. In the present embodiment, an X-ray beam emitted from the emission point 1 of the SOR source 10 is received by the directing means 20 which serves to adjust the sectional shape of the received X-ray beam and to correct the intensity distribution thereof. The directing means 20 directs the X-ray beam to the mask 3 and irradiates the pattern 3a of the mask 3 with this X-ray beam. Then, the X-ray beam is projected to the wafer 4 through the mask 3, by which the pattern of the mask 3 is transferred to the resist on the wafer 4. The mirror 2 of the directing means 20 serves to expand the diameter of the X-ray beam, obliquely incident on the reflection surface thereof, with respect to a sectional plane perpendicular to the generating line of the mirror 2. Also, the mirror 2 serves to reduce non-uniformness in intensity distribution of the X-ray beam on the mask 3 surface. Further, the mirror 2 is disposed so that its generating line extends substantially in parallel to the horizontal orbit plane of the SOR source 10.

While in FIG. 1B only the mirror 2 is illustrated as a component of the directing means 20, actually the directing means 20 include some other components. Examples are: a beryllium (Be) window provided to shield the inside of the exposure apparatus against the outside atmosphere to allow that the inside of the apparatus is maintained at a vacuum or it is filled with an He gas; a stop member for determining the size of the X-ray beam in accordance with the size of the pattern 3a region of the mask 3; a shutter mechanism for controlling the amount of exposure by the X-ray beam.

Figure 2:
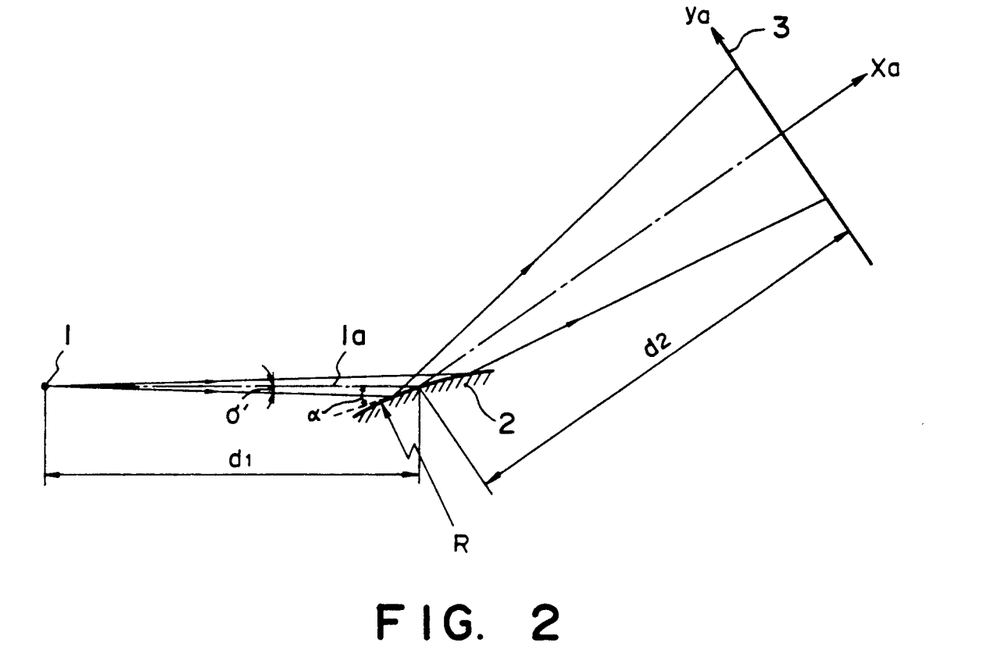
FIG. 2 is a vertical section of an illumination system used in the exposure apparatus shown in FIGS. 1A and 1B.

FIG. 2 is a sectional view of the illumination system shown in FIGS. 1A and 1B, taken on a plane including the optical axis thereof and along the vertical direction (direction $y_a$), as viewed in FIG. 1B. Like numerals as in FIGS. 1A and 1B are assigned to the elements corresponding to those of FIGS. 1A and 1B.

In FIG. 2, denoted at $d_1$ is the distance from the emission point 1 of the SOR source 10 to the center of effective X-ray beam diameter on the reflection surface of the mirror 2; at $d_2$ is the distance from the center of effective X-ray beam diameter on the reflection surface of the mirror 2 to the mask 3; at R is the radius of curvature of the mirror 2 in a sectional plane perpendicular to the generating line of the mirror; at $\alpha$ is the angle defined at the center of effective X-ray beam diameter on the reflection surface of the mirror 2, between the reflection surface and the X-ray beam projected thereto from the SOR source 10; at $\sigma'$ is a standard deviation (angle: rad) of a distribution of intensities of X-rays from the SOR source 10, having different emission angle, in a sectional plane perpendicular to the generating line of the mirror 2 and including the center 1a of the effective diameter, at the gravity center wavelength of the X-ray beam in the used wavelength region. Here, in a sectional plane ($x_a$-$y_a$ plane) perpendicular to the horizontal orbit plane of the SOR source 10 ($x_a$-$z_a$ plane in FIG. 1B), the rays of the X-ray beam from the SOR source 10 having different emission angles have a distribution of intensity which is usually in the form of a Gaussian distribution.

In FIGS. 1A, 1B and 2, the X-ray beam emitted from the emission point 1 of the SOR source 10 goes along a path in the neighborhood of a plane parallel to the horizontal orbit plane of the SOR source 10, and impinges on the convex mirror 2 having a cylindrical shape. Since the mirror 2 has a curvature with respect to the plane of vertical section ($x_a$-$y_a$ plane), it serves to reflect the received X-ray beam so as to expand the angle of divergence of the X-ray beam in the vertical direction ($y_a$ direction). As a result, on the mask 3 surface, an X-ray beam expanded sufficiently in the vertical direction, is obtainable. Further, in the present embodiment, the mirror 2 is structured so as to satisfy equations to be set forth below, to thereby reduce the non-uniformness in intensity distribution (Gaussian distribution) of the X-ray beam on the mask 3 surface, with respect to the vertical ($y_a$) direction.

$$R = (2d_1 d_2 \sigma')/\{[\Delta - (d_1 + d_2)\sigma'] \cdot a\} \qquad \ldots (1\text{--}1)$$

where $d_1$: the distance from the emission point of said X-ray source to the center of effective X-ray beam diameter on said reflection surface;

$d_2$: the distance from the center of effective X-ray beam diameter on said reflection surface to the center of effective X-ray beam diameter on the surface to be exposed;

$\alpha$: the angle defined at the center of effective X-ray beam diameter on said reflection surface, between the X-ray beam and said reflection surface;

$\sigma'$: a standard deviation of a distribution of intensities of the X-rays having different angles of emission from said X-ray source, in a sectional plane perpendicular to a generating line of said mirror, at the gravity center wavelength of the X-ray beam from said X-ray source;

$\Delta$: $0.43a \leq \Delta \leq 4.0a$ (1-2); and a: the length of the surface to be exposed, with respect to a direction which is substantially perpendicular to the generating line of said mirror.

$$R = (2d_1 \cdot d_2)/\{[\Delta' - (d_1 + d_2)] \cdot a\} \qquad (2\text{-}1)$$

where $$4.3 \times 10^2 a \leq \Delta' \leq 4.0 \times 10^4 a \qquad (2\text{--}2)$$

Next, description will be made of the significance and the derivation of equations (1-1), (1-2), (2-1) and (2-2) that determine an appropriate curvature radius R of the cylindrical convex mirror 2.

First, the focal length f of the mirror 2 in the sectional plane ($x_a$-$y_a$ plane) perpendicular to the generating line of the mirror 2 is given by:

$$f = -R \sin \alpha/2 \approx -R\alpha/2 \qquad (3)$$

where $$R > 0, \alpha > 0 \text{ and } f < 0$$

Approximating the mirror 2 as a thin lens, examination will now be made as to the degree of expansion, on the mask 3 surface, of the paraxial rays emitted from an object point on the axis (SOR emission point 1).

Figure 3:
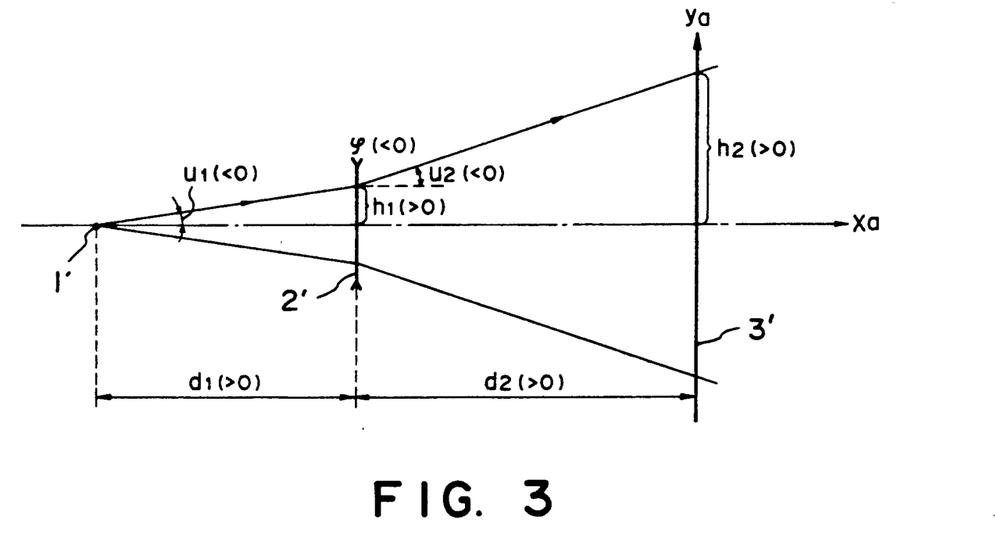
FIG. 3 is a schematic illustration, for explaining the paraxial relation of the mirror shown in FIGS. 1A and 1B.

FIG. 3 illustrates the paraxial relation of the thin lens. In this Figure, denoted at 1' is the center position of the emission point 1 of the SOR source 10; at 2' is a thin lens which is an approximation of the mirror; at 3' is a surface that corresponds to the mask 3; at $\phi$ is the refracting power ($=1/f$) of the thin lens (i.e. the mirror); $d_1$ is the distance from the emission point center position 1' to the thin lens 2'; at $d_2$ is the distance from the thin lens 2' to the surface 3'; at $u_1$ and $u_2$ are half angles of divergence of the X-ray beams just emitted from the emission point center position 1' and the thin lens 2', respectively; at $h_1$ and $h_2$ are the radii (heights of incidence) of the X-ray beams, in the $y_a$ direction, incident on the thin lens 2' and the surface 3', respectively. The signs are such as those illustrated in the drawing.

From the paraxial relationship, the following relations are established:

$$h_1 = -d_1 \cdot u_1 \qquad (4)$$

$$u_2 = u_1 + h_1 \phi \qquad (5)$$

$$h_2 = h_1 - d_2 u_2 \qquad (6)$$

By erasing $h_1$ and $u_2$ in equations (4)-(6), $h_2$ is expressed as follows:

$$h_2 = -u_1(d_1 + d_2) + d_1 d_2 u_1 \phi \qquad (7)$$

Further, by substituting the relation of equation (3) into equation (7), then $$h_2 = -u_1(d_1 + d_2) - 2u_1 d_1 d_2 / Ra \qquad (8)$$

This is the paraxial relation that represents the expansion of the X-ray beam upon the surface 3', in the vertical ($y_a$) direction. Accordingly, if a standard deviation of a distribution of intensities of the rays having different emission angles, in the vertical direction, at the gravity center wavelength in the used wavelength region of the X-ray beam is denoted by $\sigma'$ ($>0$), the height (radius) $h'_2$ from the optical axis and on the surface 3' of the X-ray beam as emitted from the center position 1' at an angle substantially corresponding to this standard deviation $\sigma'$, can be determined by substituting $u_1 = -\sigma'$ into equation (8), as follows:

$$h'_2 = \sigma'(d_1 + d_2) + 2\sigma' d_1 d_2 / Ra \qquad (9)$$

Figure 4:
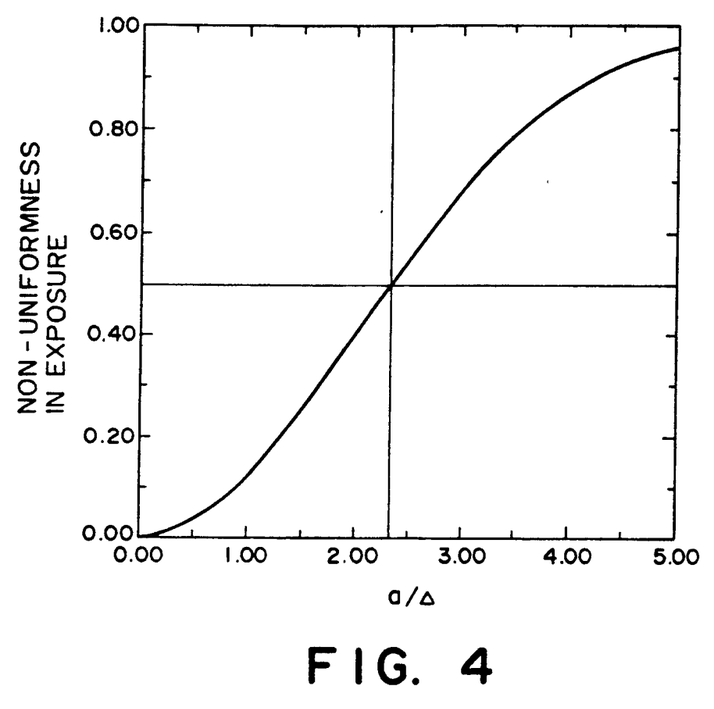
FIGS. 4 and 5 are graphs, each showing the relationship of the non-uniformness in exposure or the ratio of used light quantity, with respect to a/Δ.

By taking the height $h'_2$ in equation (9) as an effective radius $\Delta$ nd by solving the equation with respect to R, then equation (1-1) is obtained. Also, as will be understood from the foregoing description, equation (1-2) is the one that defines the range for the position of the X-ray beam that determines the standard deviation. With smaller $\Delta$, a beam of a small expansion is obtainable, and with larger $\Delta$, a beam of large expansion is obtainable. Next, the range of the value $\Delta$ suitable for the exposure will be explained. FIG. 4 is a graph showing the relationship between (i) a/$\Delta$ (the ratio of the length a (exposure area) of the surface 3a, to be exposed, in the $y_a$ direction, to the effective radius $\Delta$ of the X-ray beam on the surface 3' in the $y_a$ direction) in an occasion where, in the $x_a$-$y_a$ plane, the rays of the X-ray beam having different emission angles have a distribution of intensity which is a Gaussian distribution, and (ii) the non-uniformness on the surface 3a, to be exposed, in the $y_a$ direction (i.e. the value of "(maximum exposure strength - minimum exposure strength)/maximum exposure strength)" on the surface 3a to be exposed, with respect to the $y_a$ direction). Here, it is assumed that there is no variation in intensity (i.e. non-uniformness in exposure) with respect to the $z_a$ direction. It is seen from this graph that, in order to maintain the non-uniformness in exposure not higher than 50%, it is necessary to keep the ratio a/$\Delta$ within a range not greater than about 2.3. In other words, unless $\Delta$ is made not less than about 0.43a, the magnitude of the difference between the maximum exposure strength and the minimum exposure strength on the surface 3a to be exposed (exposure area), with respect to the maximum exposure strength, is reduced to a half or less. As a result, large non-uniformness in exposure is produced on the surface 3a to be exposed, which is not proper for use in an exposure apparatus.

Figure 5:
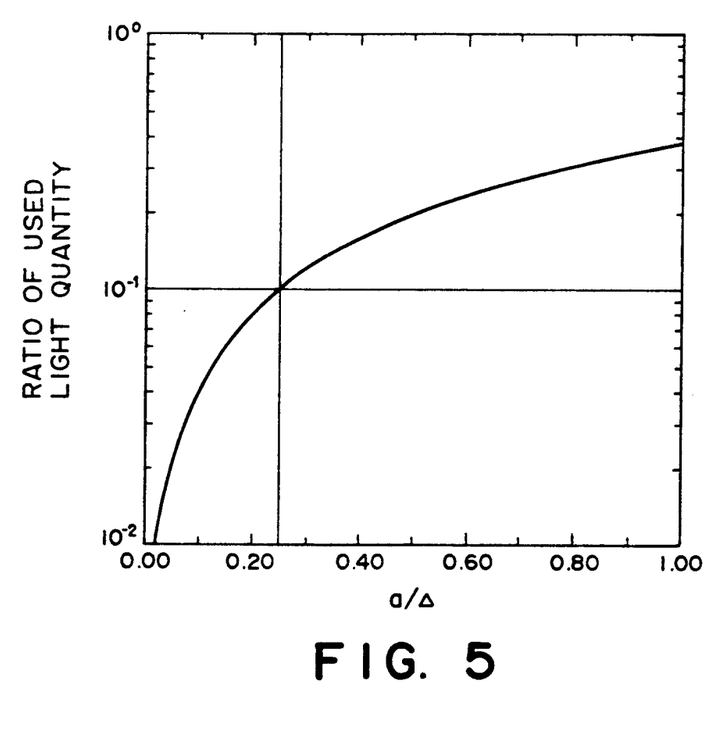

FIG. 5 is a graph showing the relationship between (i) the ratio a/$\Delta$ as described which is under the same condition as FIG. 4, and (ii) the ratio of used light quantity (the ratio of the amount of exposure on the surface 3' to the total quantity of the X-ray beam emitted from the light source). Here, it is assumed that the length of the surface 3a to be exposed, in the $z_a$ direction is substantially equal to the width of the X-ray beam in the $z_a$ direction and that it is unchangeable. In other words, this graph is one that shows to what extent the X-ray beam from the SOR source is effectively used in exposure, in dependence upon the value a/$\Delta$. If, in this graph, the ratio of used light quantity is less than 1/10, the efficiency is too low for use in an exposure apparatus. It is seen from this graph that, in order to make the ratio of used light quantity not less than 1/10, it is necessary to keep a/$\Delta$ not less than 0.25. Namely, $\Delta \leq 4a$ is the condition for an X-ray exposure apparatus.

As will be understood from the foregoing, the condition for $\Delta$ in an X-ray exposure apparatus is determined, in consideration of the length a of the surface 3a, to be exposed, with respect to the X-ray beam expanding direction ($y_a$ direction in FIG. 1), as depicted by equation (1-2), and it is determined as follows:

$$0.43a \leq \Delta \leq 4.0a$$

Accordingly, as showed by equation (1-1), the radius of curvature of the mirror 2 is expressed as follows:

$$R = (2d_1 \cdot d_2 \cdot \sigma')/\{[\Delta - (d_1 + d_2) \cdot \sigma'] \cdot a\}$$

where $$0.43a \leq \Delta \leq 0.40a$$

Namely, the condition is $$(2d_1 \cdot d_2 \cdot \sigma')/\{[4.0a - (d_1 + d_2) \cdot \sigma'] \cdot a\} \leq R \leq \qquad (10)$$

$$(2d_1 \cdot d_1 \cdot \sigma')/\{[0.43a - (d_1 + d_2) \cdot \sigma'] \cdot a\}$$

On the other hand, if $\Delta' = \Delta/\sigma'$, as showed by equation (2-1), equation (1-1) can be rewritten as follows:

$$R = (2d_1 \cdot d_2)/\{[\Delta' - (d_1 + d_2)] \cdot a\}$$

where $\Delta' = \Delta/\sigma'$

Generally, in a SOR light source, the value $\sigma'$ is in the range of $$0.1 \times 10^{-3} \leq \sigma' \leq 1.0 \times 10^{-3} \text{ (rad)} \qquad (11)$$

Therefore, from equations (1-2) and (11), as showed by equation (2-2), the following relation is obtained:

$$4.3 \times 10^2 a \leq \Delta' \leq 4.0 \times 10^4 a$$

Thus, equations (2-1) and (2-2) can be rewritten as follows:

$$R = (2d_1 \cdot d_2)/\{[\Delta' - (d_1 + d_2)] \cdot a\}$$

-continued $$4.3 \times 10^2 a \leq \Delta' \leq 4 \times 10^4 a$$

From these equations, the following relation is determined:

$$(2d_1 \cdot d_1)/\{[4.0 \times 10^4 a - (d_1 - d_2)] \cdot a\} \leq R \leq \quad (12)$$

$$(2d_1 \cdot d_2)/\{[4.3 \times 10^2 a - (d_1 + d_2)] \cdot a\}$$

Examples will now be described in detail.
The parameters in equation (1-1) were set as follows:

$$d_1 = 5000 \ (mm)$$

$$d_2 = 5000 \ (mm)$$

$$\sigma' = 5.0 \times 10^{-4} \ (rad)$$

$$a = 1.0 \times 10^{-2} \ (rad)$$

$$a = 30 \ (mm)$$

By setting the parameters in this manner, from equation (10) the following relation is obtained:

$$2.2 \times 10^4 \leq R \leq 3.2 \times 10^5 \quad (13)$$

(unit:mm)

Figure 6:
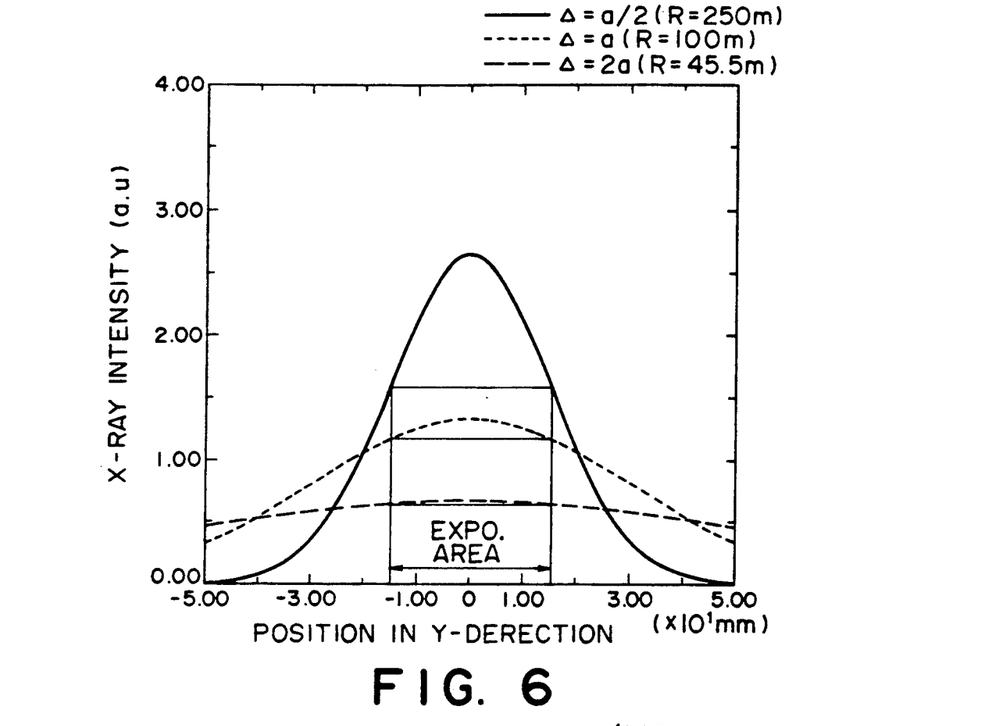
FIG. 6 is a graph showing an X-ray intensity distribution upon a surface to be exposed, in accordance with numerical examples of the present invention.

With the parameters set in accordance with the above-described described conditions, the relationship between the surface 3' to be exposed (exposure area) and the X-ray exposure strength was examined by using cylindrical convex mirrors of $R=250 \ m$ ($\Delta = a/2$), $R=100 \ m (\Delta = a)$ and $R=45.5 \ m$ ($\Delta = 2a$), respectively. The results are illustrated in FIG. 6. In this Figure, the axis of abscissa depicts the position in the $y_a$ direction with the origin being at the center of the surface 3' to be exposed, while the axis of ordinate depicts the X-ray intensity at each point (relative value of the X-ray intensity at each point, relative to the value of the intensity of the X-ray beam emitted from the cylindrical convex mirror as integrated with respect to the area on the surface 3' to be exposed).

Figure 7:
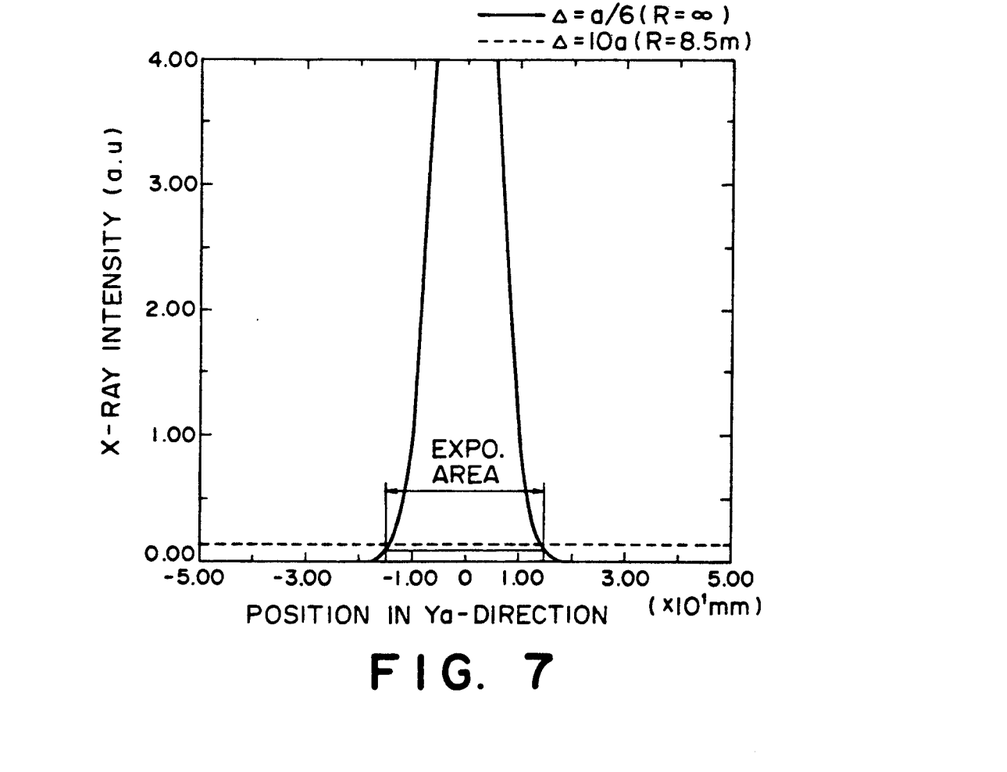
FIG. 7 is a graph showing a comparative example.

As a comparative example, FIG. 7 shows a graph of the X-ray intensity distribution which was obtained in a similar manner as in FIG. 6, but with use of a cylindrical convex mirror of $R=8.5 \ m$ ($\Delta = 10a$) and a mirror $R = \infty$ ($\Delta = a/6$), namely, a flat mirror, which were out of the range of the curvature radius as determined in accordance with the present invention.

As will be understood from these Figures, if R is within the range as defined in accordance with the present invention, the non-uniformness in exposure can be kept within a tolerable range (the light quantity at the peripheral portion is not less than a half of that of the central portion). Also, the proportion of the quantity of used light to the total quantity is not too small.

With the X-ray exposure apparatus of the present embodiment, as described hereinbefore, the whole surface to be exposed can be exposed at a time. This avoids the possibility of local thermal distortion of the mask due to displacement of the X-ray beam. Further, the apparatus includes a mirror having a radius of curvature which is suitable for ensuring the amount of exposure as required in a practical exposure apparatus, and also which is effective to reduce the non-uniformness in intensity distribution of the X-ray beam. Therefore, the present invention is effective to make it easier to provide a practical X-ray exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, comprising:
   an X-ray source; and
   directing means for directing an X-ray beam from said X-ray source to a surface to be exposed, said directing means including a mirror having a convex cylindrical reflection surface of a curvature radius R, for reflecting the X-ray beam and for expanding the diameter thereof; wherein said mirror satisfies the following condition:

$$R = (2d_1 d_2 \sigma')/\{[\Delta - (d_1 + d_2)\sigma'] \cdot a\}$$

where
$d_1$: the distance from the emission point of said X-ray source to the center of effective X-ray beam diameter on said reflection surface;
$d_2$: the distance from the center of effective X-ray beam diameter on said reflection surface, to the center of effective X-ray beam diameter on the surface to be exposed;
$a$: the angle defined at the center of effective X-ray beam diameter on said reflection surface, between the X-ray beam and said reflection surface;
$\sigma'$: a standard deviation of a distribution of intensities of the rays having different angles of emission from said X-ray source, in a sectional plane perpendicular to a generating line of said mirror, at the gravity center wavelength of the X-ray beam from said X-ray source;
$\Delta$: $0.43a \leq \Delta \leq 4.0a$; and
$a$: the length of the surface to be exposed, with respect to a direction which is substantially perpendicular to the generating line of said mirror.

2. An apparatus according to claim 1, wherein said X-ray source comprises a synchrotron orbit radiation source.

3. An apparatus according to claim 1, wherein said mirror further satisfies the following conditions:

$$R = (2d_1 \cdot d_2)/\{[\Delta' - (d_1 + d_2)] \cdot a\}$$

where $4.3 \times 10^2 a \leq \Delta' \leq 4.0 \times 10^4 a$.

4. An X-ray exposure apparatus, comprising:
   means for supporting a mask;
   means for supporting a wafer; and
   directing means for directing an X-ray beam from an X-ray source to the wafer through the mask to thereby expose the wafer to a pattern of the mask, said directing means including a mirror having a convex cylindrical reflection surface of a curvature radius R, for reflecting the X-ray beam and for expanding the diameter thereof;
   wherein said mirror satisfies the following condition:

$$R = (2d_1 d_2 \sigma')/\{[\Delta - (d_1 + d_2)\sigma'] \cdot a\}$$

where $d_1$: the distance from the emission point of said X-ray source to the center of effective X-ray beam diameter on said reflection surface;

$d_2$: the distance from the center of effective X-ray beam diameter on said reflection surface to the center of effective X-ray beam diameter on the mask;

$\alpha$: the angle defined at the center of effective X-ray beam diameter on said reflection surface, between the X-ray beam and said reflection surface;

$\sigma'$: a standard deviation of a distribution of intensities of the rays having different angles of emission from said X-ray source, in a sectional plane perpendicular to a generating line of said mirror, at the gravity center wavelength of the X-ray beam from said X-ray source;

$\Delta$: $0.43a \leq \Delta \leq 4.0a$; and a: the length of an area for the pattern of the mask, with respect to a direction which is substantially perpendicular to the generating line of said mirror.

5. An apparatus according to claim 4, wherein said X-ray source comprises a synchrotron orbit radiation source.

6. An apparatus according to claim 4, wherein said mirror further satisfies the following conditions:

$$R = (2d_1 \cdot d_2)/\{[\Delta' - (d_1 + d_2)] \cdot \alpha\}$$

where $4.3 \times 10^2 a \leq \Delta' \leq 4.0 \times 10^4 a$.

7. An X-ray exposure apparatus, comprising:
an X-ray source; and
directing means for directing an X-ray beam from said X-ray source to a surface to be exposed, said directing means including a mirror having a convex reflection surface of a curvature radius R with respect to a predetermined sectional plane, for reflecting the X-ray beam and for expanding the diameter thereof with respect to said sectional plane;
wherein said mirror satisfies the following conditions:

$$R = (2d_1 d_2 \sigma')/\{[\Delta - (d_1 + d_2)\sigma'] \cdot \alpha\}$$

where $d_1$: the distance from the emission point of said X-ray source to the center of effective X-ray beam diameter on said reflection surface;

$d_2$: the distance from the center of effective X-ray beam diameter on said reflection surface to the center of effective X-ray beam diameter on the surface to be exposed;

$\alpha$: the angle defined at the center of effective X-ray beam diameter on said reflection surface, between the X-ray beam and said reflection surface;

$\sigma'$: a standard deviation of a distribution of intensities of the rays having different emission angles at said sectional plane, at the gravity center wavelength of the X-ray beam from said X-ray source;

$\Delta$: $0.43a \leq \Delta \leq 4.0a$; and a: the length of the surface to be exposed, with respect to said sectional plane.

8. An apparatus according to claim 7, wherein said reflection surface comprises a substantially cylindrical convex surface having a generating line, and wherein said mirror is provided so that the generating line of said convex surface intersects said sectional plane perpendicularly.

9. An apparatus according to claim 8, wherein said X-ray source comprises a synchrotron orbit radiation source.

10. An apparatus according to claim 9, wherein said mirror is provided so that the generating line extends substantially in parallel to a horizontal orbit plane of said synchrotron orbit radiation source.

11. An apparatus according to claim 10, wherein said mirror further satisfies the following conditions:

$$R = (2d_1 \cdot d_2)/\{[\Delta' - (d_1 + d_2)] \cdot \alpha\}$$

where $4.3 \times 10^2 a \leq \Delta' \leq 4.0 \times 10^4 a$.

12. An apparatus according to claim 10, further comprising means for supporting a mask having a pattern to be set as the surface to be exposed, and means for supporting a wafer to which the pattern of the mask is to be transferred with the X-ray beam.

13. An X-ray exposure apparatus, comprising:
means for holding a substrate to be exposed; and
directing means for directing an X-ray beam from a radiation source to the substrate, said directing means including a mirror having a convex cylindrical reflection surface of a curvature radius R, for reflecting the X-ray beam to project it to the substrate;
wherein said mirror satisfies the following condition:

$$R = (d_1 d_2 \sigma')/\{[\Delta - (d_1 + d_2)\sigma'] \cdot \alpha\}$$

where $d_1$: the distance from the emission point of said radiation source to the center of effective X-ray beam diameter on said reflection surface;

$d_2$: the distance from the center of effective X-ray beam diameter on said reflection surface to the center of effective X-ray beam diameter on the substrate to be exposed;

$\alpha$: the angle defined at the center of effective X-ray beam diameter on said reflection surface, between the X-ray beam and said reflection surface;

$\sigma'$: a standard deviation of a distribution of intensities of the rays having different angles of emission from said radiation source, in a sectional plane perpendicular to a generating line of said mirror, at the gravity center wavelength of the X-ray beam from said radiation source;

$\Delta$: $0.43a \leq \Delta \leq 4.0a$; and a: the length of the substrate to be exposed, with respect to a direction which is substantially perpendicular to the generating line of said mirror.

14. An apparatus according to claim 13, wherein said mirror further satisfies the following conditions:

$$R = (2d_1 \cdot d_2)/\{[\Delta' - (d_1 + d_2)] \cdot \alpha\}$$

where $4.3 \times 10^2 a \leq \Delta' \leq 4.0 \times 10^4 a$.

15. An apparatus according to claim 13 or 14, wherein said radiation source comprises a synchrotron.

16. A method of manufacture of semiconductor devices wherein an X-ray beam from a radiation source is reflected by a convex cylindrical mirror toward a substrate to be exposed by which a circuit pattern is printed on the substrate, characterized in that said mirror has a curvature radius R which satisfies the following conditions:

$$R = (2d_1 d_2 \sigma')/\{[\Delta - (d_1 + d_2)\sigma'] \cdot a\}$$

where

- $d_1$: the distance from the emission point of said radiation source to the center of effective X-ray beam diameter on said mirror;
- $d_2$: the distance from the center of effective X-ray beam diameter on said mirror to the center of effective X-ray beam diameter on the substrate to be exposed;
- $a$: the angle defined at the center of effective X-ray beam diameter on said mirror, between the X-ray beam and said mirror;
- $\sigma'$: a standard deviation of a distribution of intensities of the rays having different angles of emission from said radiation source, in a sectional plane perpendicular to a generating line of said mirror, at the gravity center wavelength of the X-ray beam from said radiation source;
- $\Delta$: $0.43a \leq \Delta \leq 4.0a$; and
- a: The length of the substrate to be exposed, with respect to a direction which is substantially perpendicular to the generating line of said mirror.

17. A method according to claim 16, wherein said mirror further satisfies the following conditions:

$$R = (2d_1 \cdot d_2)/\{[\Delta' - (d_1 + d_2)] \cdot a\}$$

where $4.3 \times 10^2 a \leq \Delta' \leq 4.0 \times 10^4 a$.

18. A method according to claim 16 or 17, wherein the X-ray beam is supplied from a synchrotron.

19. A method of manufacture of semiconductor devices wherein an X-ray beam from a radiation source is reflected by a convex cylindrical mirror toward a circuit pattern so that a substrate is exposed to the circuit pattern with the X-ray beam, by which the circuit pattern is printed on the substrate, characterized in that said mirror has a curvature radius R which satisfies the following condition:

$$R = (2d_1 d_2 \sigma')/\{[\Delta - (d_1 + d_2)\sigma'] \cdot a\}$$

where

- $d_1$: the distance from the emission point of said radiation source to the center of effective X-ray beam diameter on said mirror;
- $d_2$: the distance from the center of effective X-ray beam diameter on said mirror to the center of effective X-ray beam diameter on the substrate to be exposed;
- $a$: the angle defined at the center of effective X-ray beam diameter on said mirror, between the X-ray beam and said mirror;
- $\sigma'$: a standard deviation of a distribution of intensities of the rays having different angles of emission from said radiation source, in a sectional plane perpendicular to a generating line of said mirror, at the gravity center wavelength of the X-ray beam from said radiation source;
- $\Delta$: $0.43a \leq \Delta \leq 4.0a$; and
- a: the length of the substrate to be exposed, with respect to a direction which is substantially perpendicular to the generating line of said mirror.

20. A method according to claim 19, wherein said mirror further satisfies the following conditions:

$$R = (2d_1 \cdot d_2)/\{[\Delta' - (d_1 + d_2)] \cdot a\}$$

where $4.3 \times 10^2 a \leq \Delta' \leq 4.0 \times 10^4 a$.

21. A method according to claim 19, or 20, wherein the X-ray beam is supplied from a synchrotron.

22. An Xray exposure apparatus, comprising:
means for holding a substrate to be exposed; and
directing means for directing an X-ray beam from a radiation source to the substrate, said directing means including a mirror having a convex reflection surface of a curvature radius R with respect to a predetermined sectional plane for reflecting the X-ray beam to project it to the substrate;
wherein said mirror satisfies the following condition:

$$R = (2d_1 d_2 \sigma')/\{[\Delta - (d_1 + d_2)\sigma'] \cdot a\}$$

where

- $d_1$: the distance from the emission point of said radiation source to the center of effective X-ray beam diameter on said reflection surface;
- $d_2$: the distance from the center of effective X-ray beam diameter on said reflection surface to the center of effective X-ray beam diameter on the substrate to be exposed;
- $a$: the angle defined at the center of effective X-ray beam diameter on said reflection surface, between the X-ray beam and said reflection surface;
- $\sigma'$: a standard deviation of a distribution of intensities of the rays having different angles at said sectional plane, at the gravity center wavelength of the X-ray beam from said radiation source;
- $\Delta$: $0.43a \leq \Delta \leq 4.0a$; and
- a: the length of the substrate to be exposed, with respect to said sectional plane.

23. An apparatus according to claim 22, wherein said mirror further satisfies the following condition:

$$R = (2d_1 \cdot d_2)/\{[\Delta' - (d_1 + d_2)] \cdot a\}$$

where $4.3 \times 10^2 a \leq \Delta' \leq 4.0 \times 10^4 a$.

24. An apparatus according to claim 22 or 23, wherein said radiation source comprises a synchrotron.

25. A method of manufacture of semiconductor devices wherein an X-ray beam from a radiation source is reflected by a convex reflection mirror toward a substrate to be exposed by which a circuit pattern is printed on the substrate, characterized in that said mirror has a curvature radius R with respect to a predetermined sectional plane which curvature radius satisfies the following condition:

$$R = (2d_1 d_2 \sigma')/\{[\Delta - (d_1 + d_2) \cdot a\}$$

where

- $d_1$: the distance from the emission point of said radiation source to the center of effective X-ray beam diameter on said mirror;
- $d_2$: the distance from the center of effective X-ray beam diameter on said mirror to the center of effective X-ray beam diameter on the substrate to be exposed;
- $a$: the angle defined at the center of effective X-ray beam diameter on said mirror, between the X-ray abeam and said mirror;
- $\sigma'$: a standard deviation of a distribution of intensities of the rays having different angles at said sectional plane, at the gravity center wavelength of the X-ray beam from said radiation source;
- $\Delta$: $0.43a \leq \Delta \leq 4.0a$; and a: the length of the substrate to be exposed with respect to said sectional plane.

26. A method according to claim 25, wherein said mirror further satisfies the following condition;

$$R = (2d_1d_2)/\{[\Delta' - (d_1+d_2)]\cdot a\}$$

where $4.3\times 10^2 a \leqq \Delta' \leqq 4.0\times 10^4 a$.

27. A method according to claim 25 or 26, wherein the X-ray beam is supplied from a synchrotron.

* * * * *

UNITED STATES PATENT AND TRADEMARK OFFICE
CERTIFICATE OF CORRECTION

PATENT NO. : 5,127,029

DATED : June 30, 1992

INVENTOR(S) : MASAYUKI SUZUKI ET AL.

It is certified that error appears in the above-identified patent and that said Letters Patent is hereby corrected as shown below:

On the Title page, col. 1, item

[56] REFERENCES CITED

Foreign Patent Documents,
"1041900  2/1989  Japan" should read
--1-041900  1/1989  Japan--.

Other Publications,
Under Golovchenko et al.,
"synchroton radiation source"," should read
--synchrotron radiation sources",--.
Under Webb et al.,
"Synchroton Radiation"," should read
--Synchrotron Radiation",--.

Drawings:
SHEET 4 OF 4

FIG. 6, "Y-DERECTION" should read --Y-DIRECTION--.

COLUMN 2

Line 18, "conditions:" should read --condition:--.

COLUMN 3

Line 65, "because: With" should read --because, with--.

COLUMN 7

Line 37, "nd" should read --and--.

UNITED STATES PATENT AND TRADEMARK OFFICE
CERTIFICATE OF CORRECTION

PATENT NO. : 5,127,029

DATED : June 30, 1992

INVENTOR(S) : MASAYUKI SUZUKI ET AL.

It is certified that error appears in the above-identified patent and that said Letters Patent is hereby corrected as shown below:

COLUMN 9

Line 30, "described" should be deleted.

COLUMN 10

Line 28, "surface," should read --surface--.
Line 49, "conditions:" should read --condition:--.

COLUMN 11

Line 25, "conditions:" should read --condition:--.
Line 41, "conditions:" should read --condition:--.

COLUMN 12

Line 9, "conditions:" should read --condition:--.
Line 29, "$R=(d_1 d_2 \sigma')/\{[\Delta-(d_1+d_2)\sigma]\cdot\alpha\}$" should read --$R=(2d_1 d_2 \sigma')/\{[\Delta-(d_1+d_2)\sigma]\cdot\alpha\}$--.
Line 54, "conditions:" should read --condition:--.
Line 67, "conditions:" should read --condition:--.

COLUMN 13

Line 25, "conditions:" should read --condition:--.
Line 64, "conditions:" should read --condition:--.

COLUMN 14

Line 3, "Xray" should read --X-ray--.
Line 63, "abeam" should read --beam--.

UNITED STATES PATENT AND TRADEMARK OFFICE
CERTIFICATE OF CORRECTION

PATENT NO. : 5,127,029
DATED : June 30, 1992
INVENTOR(S) : MASAYUKI SUZUKI ET AL.

It is certified that error appears in the above-identified patent and that said Letters Patent is hereby corrected as shown below:

<u>COLUMN 15</u>

Line 5, "condition;" should read --condition:--.

Signed and Sealed this

Twenty-eighth Day of September, 1993

Attest:

BRUCE LEHMAN

*Attesting Officer*　　　　*Commissioner of Patents and Trademarks*